(12) United States Patent
Welch et al.

(10) Patent No.: US 8,987,889 B2
(45) Date of Patent: Mar. 24, 2015

(54) SEMICONDUCTOR PACKAGE WITH INTEGRATED INTERFERENCE SHIELDING AND METHOD OF MANUFACTURE THEREOF

(71) Applicant: Skyworks Solutions, Inc., Woburn, MA (US)

(72) Inventors: Patrick Lawrence Welch, Laguna Niguel, CA (US); Yifan Guo, Aliso Viejo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/299,895

(22) Filed: Jun. 9, 2014

(65) Prior Publication Data
US 2014/0353807 A1  Dec. 4, 2014

Related U.S. Application Data

(60) Continuation of application No. 13/740,436, filed on Jan. 14, 2013, now Pat. No. 8,748,230, which is a division of application No. 12/958,917, filed on Dec. 2, 2010, now Pat. No. 8,373,264, which is a continuation of application No. PCT/US2008/071832, filed on Jul. 31, 2008.

(51) Int. Cl.
*H01L 23/48* (2006.01)
*H01L 23/552* (2006.01)
*H01L 23/00* (2006.01)

(52) U.S. Cl.
CPC ............. *H01L 23/552* (2013.01); *H01L 24/49* (2013.01); *H01L 24/33* (2013.01); *H01L 2224/4909* (2013.01); *H01L 2224/49096* (2013.01); *H01L 2224/4945* (2013.01); *H01L 2224/48091* (2013.01); *H01L 2224/33181* (2013.01)
USPC ............ 257/692; 257/E21.499; 257/E23.114; 438/117

(58) Field of Classification Search
USPC ............ 257/692, E21.499, E23.114; 438/117
See application file for complete search history.

(56) References Cited

U.S. PATENT DOCUMENTS 6,433,277 B1  8/2002 Glenn
6,777,268 B2  8/2004 Jiang
(Continued)

FOREIGN PATENT DOCUMENTS

JP  2003086621 A  3/2003
JP  2003163314 A  6/2003
(Continued)

*Primary Examiner* — Marvin Payen
(74) *Attorney, Agent, or Firm* — Lando & Anastasi, LLP

(57) ABSTRACT

An integrated electromagnetic interference (EMI) shield for a semiconductor module package. The integrated EMI shield includes a plurality of wirebond springs electrically connected between a ground plane in the substrate of the package and a conductive layer printed on the top of the package mold compound. The wirebond springs have a defined shape that causes a spring effect to provide contact electrical connection between the tops of the wirebond springs and the conductive layer. The wirebond springs can be positioned anywhere in the module package, around all or some of the devices included in the package, to create a complete EMI shield around those devices.

13 Claims, 8 Drawing Sheets

(56) References Cited

U.S. PATENT DOCUMENTS

| | | |
|---|---|---|
| 6,956,283 B1 | 10/2005 | Peterson |
| 7,030,469 B2 | 4/2006 | Mahadevan et al. |
| 7,061,119 B1 | 6/2006 | Jiang |
| 7,084,656 B1 | 8/2006 | Khandros et al. |
| 7,898,066 B1 | 3/2011 | Scanlan et al. |
| 2007/0163802 A1 | 7/2007 | Monthei |
| 2007/0241440 A1 | 10/2007 | Hoang et al. |
| 2008/0014678 A1 | 1/2008 | Howard et al. |

FOREIGN PATENT DOCUMENTS

| | | |
|---|---|---|
| JP | 2005050868 A | 2/2005 |
| JP | 2005072392 A | 3/2005 |
| JP | 2007507108 A | 3/2007 |
| JP | 2010010441 A | 1/2010 |
| JP | 2010027996 A | 2/2010 |

SEMICONDUCTOR PACKAGE WITH INTEGRATED INTERFERENCE SHIELDING AND METHOD OF MANUFACTURE THEREOF

CROSS-REFERENCE TO RELATED APPLICATIONS

This application is a continuation of and claims priority under 35 U.S.C. §120 to co-pending U.S. application Ser. No. 13/740,436, filed Jan. 14, 2013, titled "SEMICONDUCTOR PACKAGE WITH INTEGRATED INTERFERENCE SHIELDING AND METHOD OF MANUFACTURE THEREOF," and now U.S. Pat. No. 8,748,230, which is a divisional application and claims priority under 35 U.S.C. §121 to U.S. application Ser. No. 12/958,917, filed Dec. 2, 2010, titled "SEMICONDUCTOR PACKAGE WITH INTEGRATED INTERFERENCE SHIELDING AND METHOD OF MANUFACTURE THEREOF," now U.S. Pat. No. 8,373,264, which is a continuation of and claims priority under 35 U.S.C. §§120 and 363 to International Application No. PCT/US2008/071832 filed Jul. 31, 2008 and titled "SEMICONDUCTOR PACKAGE WITH INTEGRATED INTERFERENCE SHIELDING AND METHOD OF MANUFACTURE THEREOF," each of which is herein incorporated by reference in its entirety.

BACKGROUND

1. Field of Invention

The present invention is directed to semiconductor device packages and, more particularly, to electromagnetic and/or radio frequency interference shielding for semiconductor devices.

2. Discussion of Related Art

There exists a general need in radio frequency (RF) communication systems for RF devices to be isolated from electromagnetic (radio frequency) interference (EMI) generated by other RF devices in order to maintain proper device performance. Similarly, the RF devices generally need to be isolated from the electromagnetic interference received from, or transmitted to, the environment.

The traditional method of isolating RF devices from such electromagnetic interference is to cover the RF device with a grounded metal enclosure typically called a "can." However, this solution is costly and lacks design flexibility. In addition, the metal can adds significant size to the device footprint on a printed circuit board, and also adds weight to the printed circuit board.

SUMMARY OF THE INVENTION

Aspects and embodiments of the present invention are directed to a semiconductor device package, and methods of making the same, that uses wirebond process technologies to integrate an electromagnetic interference shield into the device package. In one embodiment, wirebond processes are used to form wirebond springs that are positioned around the device and coupled to conductive layers above and below the device, thereby forming an electromagnetic interference shield around the device. As discussed further below, the shape of and spring effect created by the wirebond springs enable a robust manufacturing process to create reliable electrical connections between a conductive layer at the top of the molded package and a ground plane in the substrate of the package. The use of these wirebond springs provides a flexible solution for integrated electromagnetic interference shielding that may be applied to any over-molded device.

One aspect is directed to a packaged semiconductor module having an integrated electromagnetic interference shield. In one embodiment, the packaged semiconductor module comprises a substrate having a ground plane, an electronic device mounted on a surface of the substrate, a plurality of wirebond springs disposed about the electronic device and electrically coupled to the ground plane, a mold compound covering the electronic device and at least partially covering the plurality of wirebond springs, and a conductive layer disposed on a top surface of the mold compound and electrically coupled to at least some of the plurality of wirebond springs, wherein the plurality of wirebond springs, the conductive layer and the ground plane together comprise the integrated electromagnetic interference shield.

In one example, the conductive layer comprises silver-filled epoxy. The wirebond springs can be made from various conductive materials, such as gold wire or copper wire. Each of the plurality of wirebond springs may comprise a continuous loop of wire shaped to provide a spring effect that permits contact between the conductive layer and the wirebond spring to provide the electrical coupling between the conductive layer and the wirebond spring. In one example, the electronic device is an RF device.

According to another embodiment, a wirebond spring formed of a continuous loop of wire comprises a ball bond, a zone of inflection, a crest, a convex region extending between the zone of inflection and the crest, a sloping tail region, and a substantially flat region extending between the crest and the sloping tail region, wherein the zone of inflection is between the convex region and the ball bond. In one example, the crest is substantially vertically above the zone of inflection. As discussed above, the wirebond spring may be formed from a variety of conductive materials, including gold wire or copper wire. In one example, wirebond springs having this structure are used in the semiconductor module discussed above.

Another aspect is directed to a semiconductor module package having an integrated electromagnetic interference shield. In one embodiment, the semiconductor module package comprises a substrate, first and second metallized connection points disposed on a first surface of the substrate, and a wirebond spring comprising a continuous wire extending between the first metallized connection point and the second metallized connection point. The wirebond spring comprises a ball bond electrically connected to the first metallized connection point, a zone of inflection, a crest, a convex region extending between the zone of inflection and the crest, a substantially flat region proximate the crest, and a sloping tail region extending between the substantially flat region and the second metallized connection point. In one example, the semiconductor module package further comprises a ground plane disposed on the substrate and electrically coupled to at least one of the first and second metallized connection points. In another example, the semiconductor module package further comprises an electronic device, and a plurality of additional wirebond springs substantially identical to the wirebond spring, wherein the plurality of wirebond springs are positioned on the substrate about a perimeter of the electronic device. In another example, the semiconductor module package further comprises a mold compound covering the electronic device and at least partially covering the plurality of wirebond springs, and a conductive layer disposed on a surface of the mold compound and electrically connected to at least some of the plurality of wirebond springs, wherein the ground plane, the conductive layer and the at least some of the plurality of wirebond springs together form the integrated electromagnetic interference shield.

Another aspect is directed to a method of manufacturing a module having an integrated electromagnetic interference shield. According to one embodiment, the method comprises connecting an electronic device to a substrate, providing metallizations on the substrate, forming a plurality of wirebond springs connected to the metallizations, performing a transfer molding process to encapsulate the electronic device in mold compound and to at least partially cover the plurality of wirebond springs with the mold compound, and disposing a conductive layer on a surface of the mold compound, the conductive layer electrically connected to at least some of the plurality of wirebond springs. In one example, the method further comprises ablating the surface of the mold compound, prior to disposing the conductive layer on the surface of the mold compound, to expose regions of at least some of the plurality of wirebond springs. In another example, providing metallizations includes providing a ground plane and at least one wirebond contact area electrically connected to the ground plane. In another example, forming the plurality of wirebond springs includes depositing a wire ball on the metallizations, forming a wire loop by drawing wire from the wire ball to form the wire loop having a first end connected to the wire ball and a second end, and connecting the second end to the metallizations. In another example, disposing the conductive layer on the surface of the mold compound includes painting a layer of silver-filled epoxy on the surface of the mold compound.

According to another embodiment, an electronic module comprises a substrate, an electronic device disposed on the substrate, and integrated electromagnetic interference shield formed from a plurality of discrete structures disposed substantially about the electronic device, the structures having a minimum spacing defined by a fraction of the wavelength of a signal to be shielded by the integrated electromagnetic interference shield. In one example, the fraction of the wavelength is 1/20. In another example, the plurality of discrete structures includes a plurality of wirebond springs, as discussed below.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
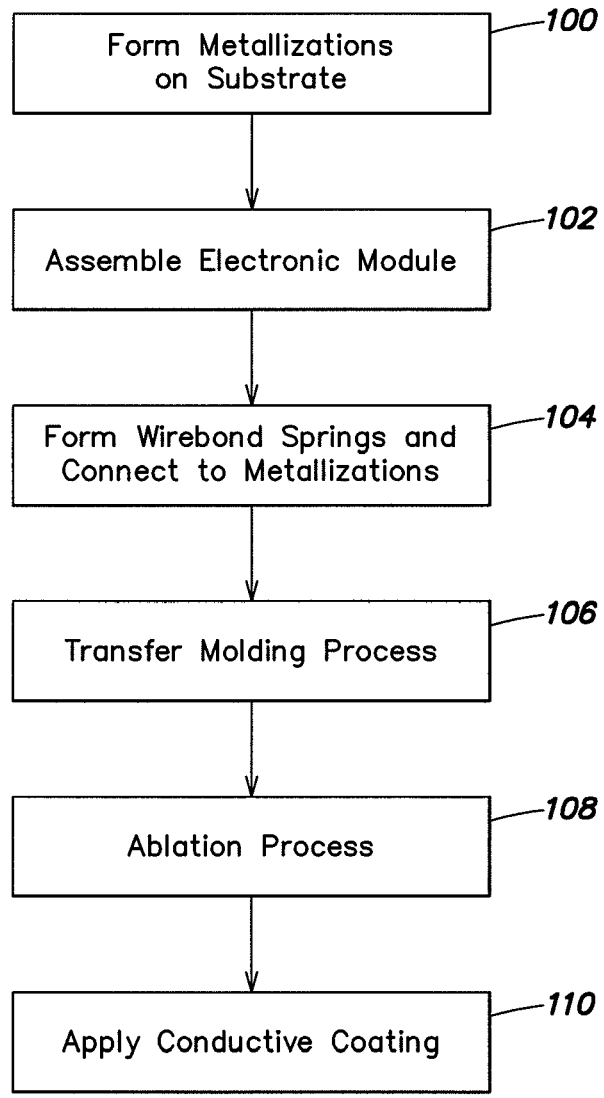
FIG. 1 is a flow diagram illustrating one example of a method of providing an integrated EMI shield as part of a packaging process, according to aspects of the invention.

In many modern applications, including cellular phone handsets, personal digital assistants (PDAs), media players, and other portable device that use radio frequency (RF) components, the size (length, width and thickness) and weight of the finished product can often be critical design parameters. For example, particularly for cellular phone handsets, there is continuing drive toward smaller and lighter devices that offer increased functionality and features. Accordingly, the size and weight of individual components used in these devices can also be important. As discussed above, the conventional approach for providing electromagnetic interference shielding for RF devices involves placing a grounded metal can over the individual RF device to be shielded, which adds size, weight and cost to the design and therefore, may be undesirable in many applications.

Aspects and embodiments are directed to methods and apparatuses to provide an interference shield that is integrated into individual devices or modules during the packaging process with minimal increase in the size and/or weight of the device or module. As used herein, the term "EMI shield" is used to refer to both electromagnetic interference and radio frequency interference shielding. In one embodiment, an integrated EMI shield can be formed using wirebond manufacturing processes, as discussed further below, and therefore, can be manufactured using existing tools and assembled on a common processing line with conventional wirebonds used to provide electrical connections to electronic devices in the module. This approach may provide high design flexibility as well as an easier and less expensive method by which to manufacture EMI shields. In addition, an integrated "wirebond cage" shield according to aspects of the invention provides a way to achieve inter/intra module isolation and low package profile, which has not been achieved by conventional existing technologies. As discussed below, a wirebond cage may be formed using "wirebond spring" connectors having a particular and well-controlled design and shape to provide a robust and practical EMI shield for various packages and process conditions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation.

Referring to FIG. 1, there is illustrated one example of a method of packaging an electronic device or module incorporating an integrated EMI shield, in accordance with aspects of the invention. Aspects and embodiments of the method are discussed below with continuing reference to FIG. 1.

A first step 100 includes preparing a substrate to be incorporated into an electronic module. This step 100 may include forming metallizations on the substrate that may be used to interconnect various components of the electronic module and at least some of which may become part of the integrated EMI shield, as discussed further below. In step 102, an electronic module may be assembled according to methods and techniques known to those skilled in the art. This step 102 may include acts such as mounting one or more dies to the substrate, forming any necessary internal or external connections or connection points (including depositing layers of metallization and/or dielectric), etc. Therefore, it is to be appreciated that although module assembly is illustrated as a single step 102 in FIG. 1, it may comprise several steps that may be performed at the same time, at different times, and/or in different locations. Furthermore, it is to be appreciated that step 100 may be considered part of step 102.

Figure 2:
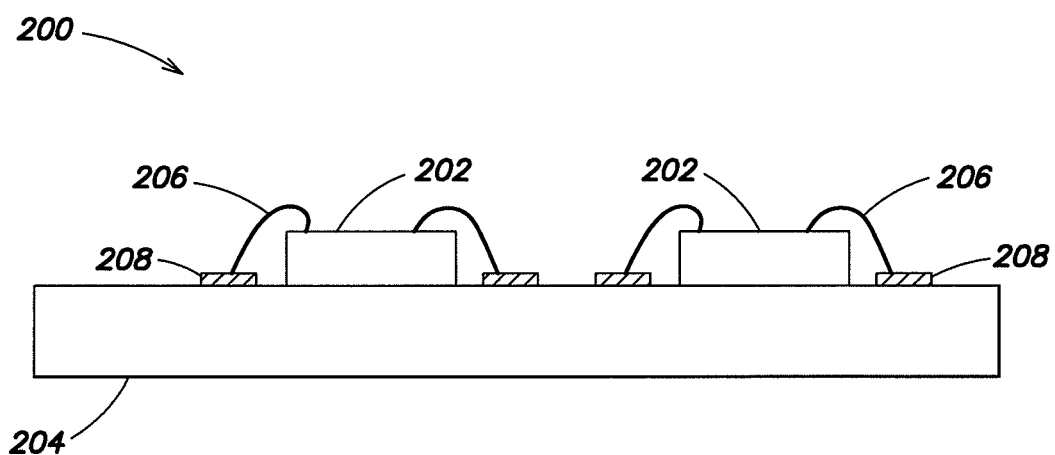
FIG. 2 is a diagram of one example of an electronic module comprising a substrate and one or more dies mounted thereto.

An example of such a module is illustrated in FIG. 2. The module 200 comprises one or more dies 202 mounted to a substrate 204. Some examples of the module 200 include, but are not limited to, power amplifiers, transceivers, linear devices, filters and other devices that may require or benefit from EMI shielding. As discussed above, EMI shielding is typically desirable for RF devices and therefore, at least one of the dies 202 may be an RF device and the module 200 may be an RF module; however, it is to be appreciated that the invention is not so limited, and the dies 202 may comprise any type of digital or analog device or component. In one example, the dies 202 are mounted to the substrate 204 using wire bonds 206 connected to bond pads 208, as illustrated in FIG. 2. Alternatively, the dies 202 may be mounted to the substrate 204 using flip chip bonding methods, or any other suitable technique known to those skilled in the art.

According to one embodiment, an integrated EMI shield is incorporated into the module 200 by constructing a wirebond cage around the edges of the substrate 204 during the packaging process. A wirebond process similar to the conventional process used to form wirebonds 206 and using the same equipment may be implemented to construct a wirebond spring, as discussed below. A plurality of these wirebond springs may be placed around the die(s) 202 on the substrate 204 and connected to ground planes in the package, as discussed further below, to provide a wirebond spring cage that forms the integrated EMI shield. To form an integrated shield in a molded module, a manufacturing difficulty lies in finding a way to connect the ground plane in the substrate to the top conductive shield layer. Embodiments of the methods of forming an integrated shield using wirebond spring connectors provide a robust manufacturing process for resolving this difficulty, as discussed further below.

Figure 3:
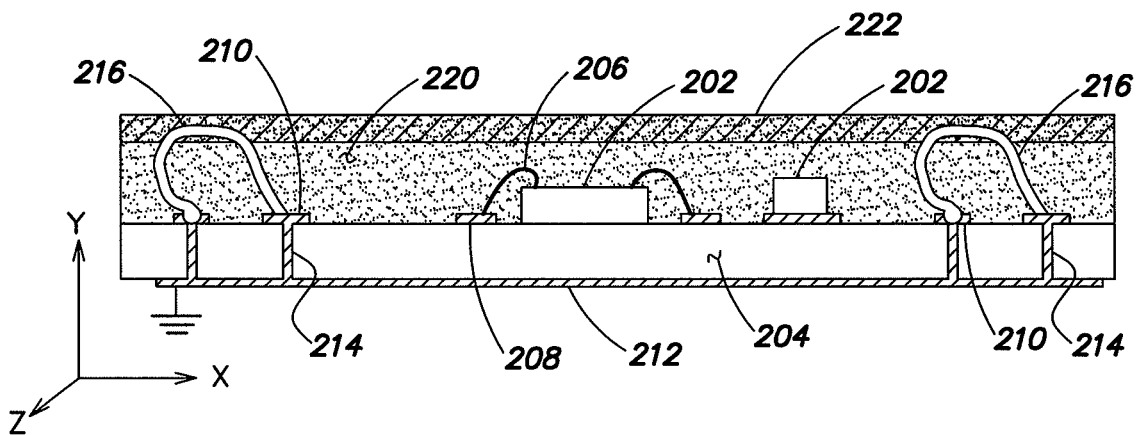
FIG. 3 is a diagram of one example of a device package incorporating an integrated EMI shield according to aspects of the invention.
Figure 4A:
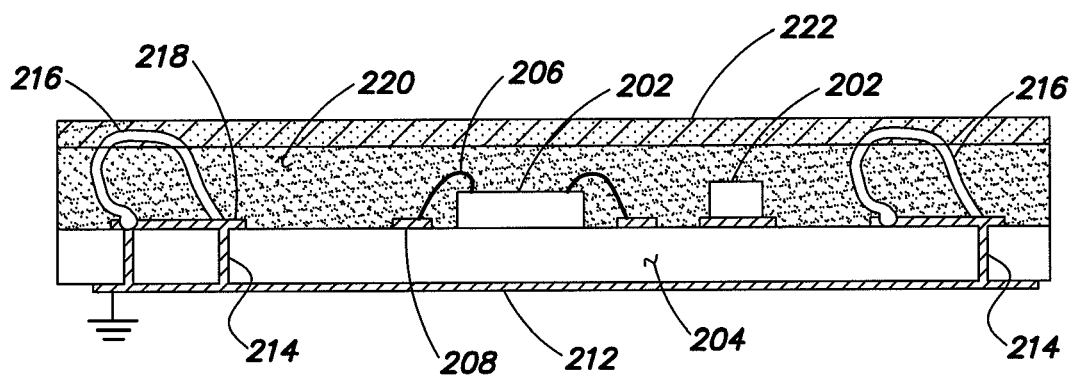
FIG. 4A is a diagram of another example of a device package incorporating an integrated EMI shield according to aspects of the invention.
Figure 4B:
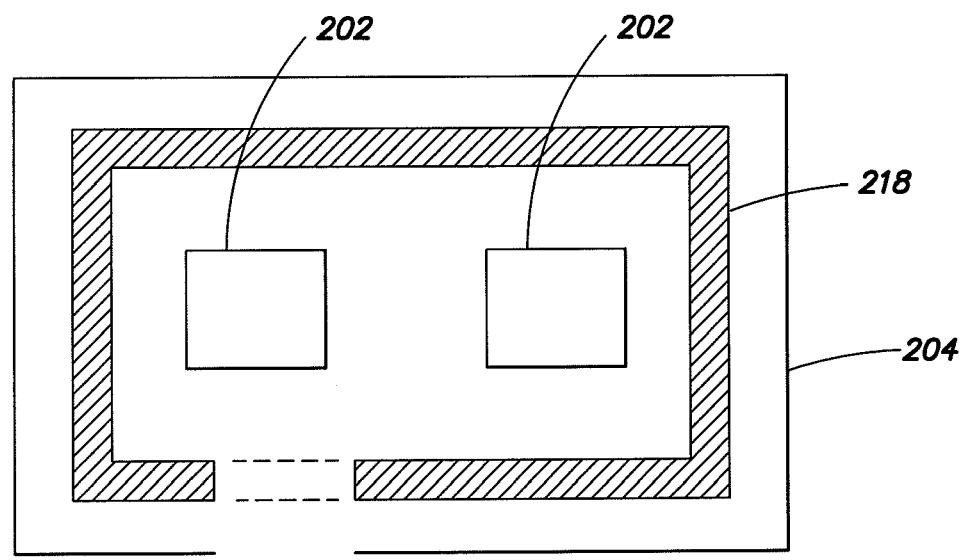
FIG. 4B is a plan view of a portion of a device package illustrating a continuous wirebond track according to aspects of the invention.

Referring again to FIG. 1, as discussed above, step 100 may include forming metallizations on the substrate 204 that will become part of the integrated EMI shield. Referring to FIG. 3, these metallizations may include wirebond pads 210, a ground plane 212, and vias 214 that connect the wirebond pads to the ground plane. Wirebond springs 216 may then be connected to the wirebond pads 210 (step 104), as discussed further below. It is to be appreciated that although in the example illustrated in FIG. 3, two discrete wirebond pads 210, with associated vias 214, are provided for each wirebond spring 216, the invention is not so limited and many other configurations are contemplated. For example, as illustrated in FIGS. 4A and 4B, the individual wirebond pads 210 may be replaced with a metallization track or ring 218 that may at least partially encircle the die(s) 202. In this example, one or more vias 214 may be provided at points along the track 218 to couple the track, and therefore the wirebond springs 216, to the ground plane 212. Furthermore, in one example, the track 218 may be continuous between two or more wirebond springs 216 and therefore, each wirebond spring need not have an individually associated via 214. In addition, although in FIG. 3, the wirebond spring 216 is illustrated with both connection points (at wirebond pads 210) coupled to the ground plane 212 by vias 214, this need not be the case, and one of the ends of the wirebond springs may be left floating (i.e., not electrically coupled to the ground plane).

According to one embodiment, the method of forming an integrated EMI shield includes a transfer molding process (step 106) to encapsulate the die(s) 202 in a mold compound 220. As discussed further below, during the transfer molding process the substrate 204 is placed in a lower mold chase, an upper mold chase is lowered onto the lower mold chase to a seal a cavity around the device, and the mold compound 220 is flowed into the cavity to encapsulate the die(s) 202 on the substrate. Transfer molding processes are well known to those skilled in the art.

Still referring to FIGS. 1 and 3, after the transfer molding process (step 106), an ablation process (step 108) may be used to expose the tops of the wirebond springs 216 through the mold compound 220. The ablation process may include, for example, a laser ablation process, grinding and/or polishing the mold compound 220 to remove a layer of mold compound and expose the tops of the wirebond springs 216. In one example, the ablation process may remove a layer of mold compound that is less than about 40 microns thick. In another example, the ablation process may remove a layer of mold compound that is about 10 microns thick. After the tops of the wirebond springs 216 have been exposed, a thin conductive coating or layer 222 may be formed on top of the mold compound 220 (step 110) to contact the exposed tops of the wirebond springs 216. The conductive layer 222 may be deposited on top of the mold compound 220 using any of various techniques known to those skilled in the art, such as, by printing, depositing, sputtering, etc. In one example, the conductive layer 222 comprises a metal-filled epoxy, such as a silver-filled epoxy, that is spray-painted on top of the mold compound 220. The conductive layer 222 contacts the exposed tops of the wirebond springs 216 and thus electrically connects the exposed wirebond springs.

As discussed above, in one embodiment, the module 200 includes a ground plane 212 disposed along a bottom surface of the substrate 204, as shown in FIG. 3, and connected to the wirebond springs 216 by vias 214. Through contact between the tops of the wirebond springs 216 and the conductive layer 222, an electrical connection is formed between the conductive layer and the ground plane 212, thus completing an EMI shield in the module 200. The wirebond springs 216 provide a flexible (because they may be located anywhere suitable on the substrate) and fully integrated connection between the ground plane 212 in the substrate 204 and the top conductive shield layer 222. In one embodiment, the wirebond springs 216 have a defined shape, as discussed further below, which is controlled to produce a spring effect that facilitates creating reliable electrical connections between the wirebond springs and the conductive layer 222. Thus, one or more of the die(s) 202 may be substantially enclosed in a grounded EMI shield formed by the conductive layer 222, the wirebond springs 216 (and their associated metallizations, such as vias 214 and bond pads 210) and the ground plane 212. This integrated EMI shield according to embodiments of the invention may add minimal size and weight to the module 200, unlike the bulky metal cans of conventional EMI shielding solutions.

According to one embodiment, the wirebond springs 216 have a particular shape and height that are well controlled and substantially different from conventional wirebonds 206. As known to those skilled in the art, conventional wirebonds 206 are formed, using a wirebonding machine, by connecting one end of a bond wire to the die 202 and controlling the movement of the wirebonding machine to draw the bond wire away from the die to form a loop, as illustrated in FIGS. 2 and 3, and then connecting the other end of the bond wire to a pad on the substrate. The wirebond springs 216 according to embodiments of the invention may be formed using a similar technique, but the wire loop is processed, by manipulating x-axis and y-axis motion of the wirebonding machine, to a unique shape that provides the desired spring effect and other properties of the wirebond spring discussed below.

Figure 5:
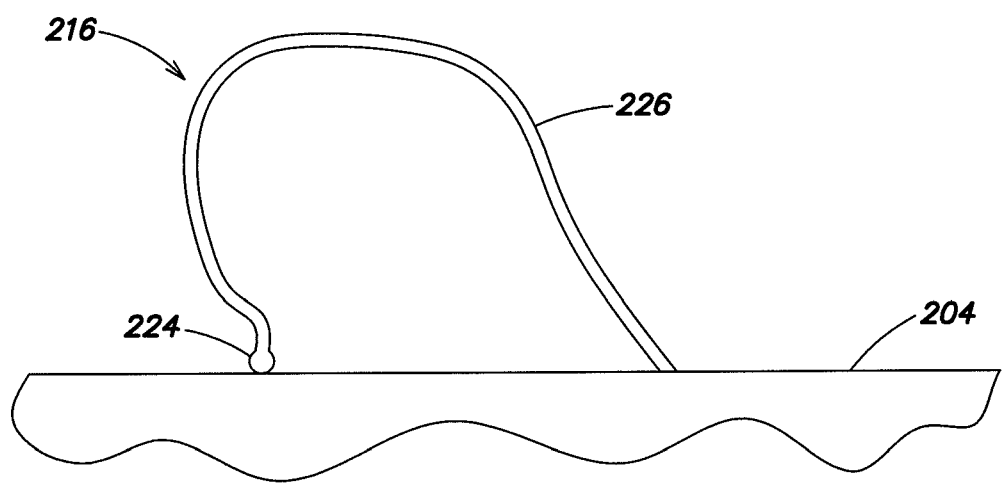
FIG. 5 is an illustration of one example of a wirebond spring according to aspects of the invention.
Figure 6:
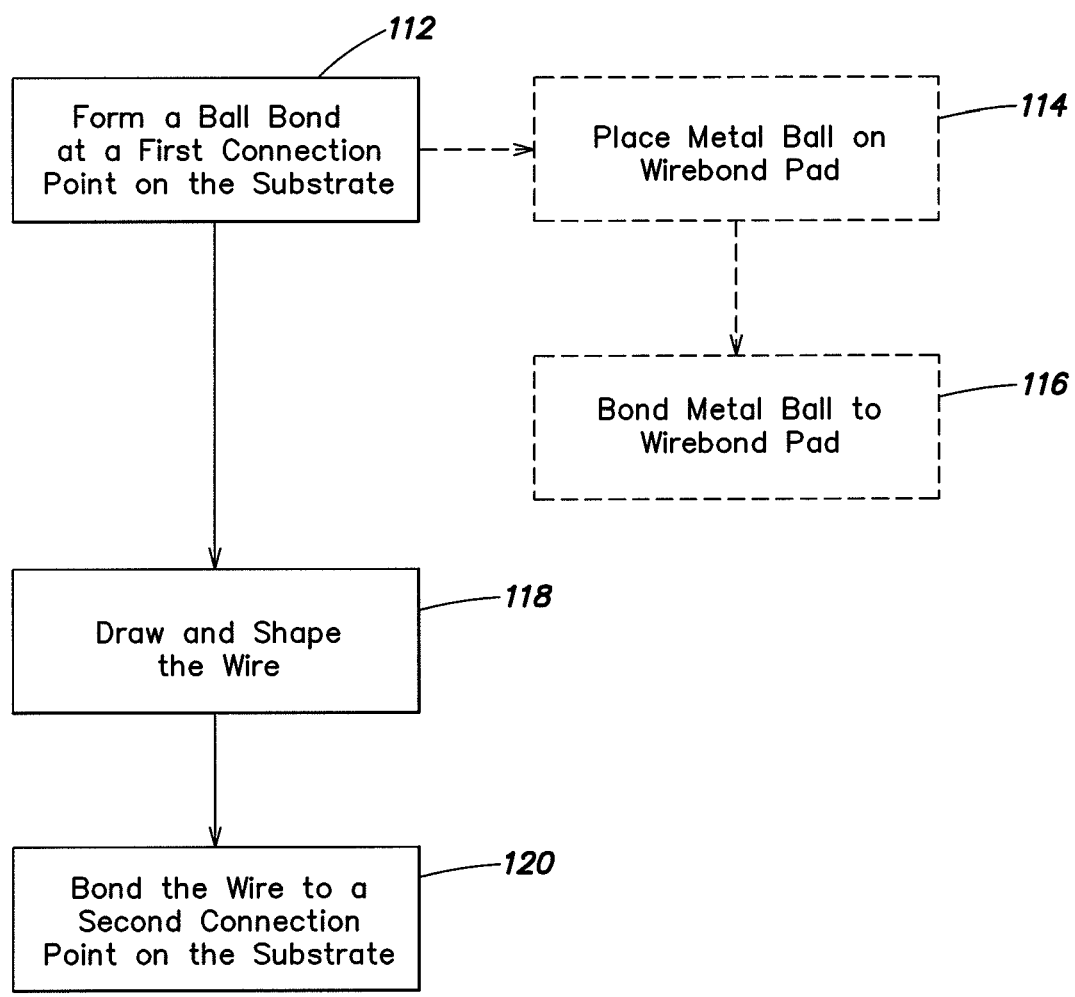
FIG. 6 is a flow diagram illustrating one example of a method of forming a wirebond spring according to aspects of the invention.

Referring to FIG. 5, there is illustrated one embodiment of a wirebond spring 216 according to aspects of the invention. The wirebond spring 216 comprises a ball bond 224, which provides a first connection point between the wirebond spring and the substrate 204, and a wire loop 226 extending from the ball bond to a second connection point 228 on the substrate. Referring to FIGS. 5 and 6, the process of forming the wirebond spring 216 (step 104) may begin with a first step 112 of forming the ball bond 224. This step may include placing a metal ball on a wirebond pad 210 (see FIG. 3) on the substrate 204 (step 114) and bonding the ball to the wirebond pad (step 116) to form the ball bond 224. The wirebond spring may be formed using any of a variety of metals, including gold (as is commonly used for conventional wirebonds) and copper. In one example, in which the wirebond spring is made of gold, the wirebond pad 210 may similarly be gold, or gold-plated, and the ball bond 224 is ultrasonically bonded to the substrate 204. A similar thermosonic process may be used to form a copper ball bond 224 on gold, copper or tin-plated wirebond pads 210.

According to one embodiment, the wire loop 226 is formed by drawing the wire from the ball bond 224, shaping the wire (step 118) by manipulating the x-axis and y-axis motion of the wirebonding machine, and finally bonding the tail end of the wire loop to the wirebond pad 210 (step 120). In one embodiment, the wire loop 226 is shaped to have the shape illustrated in FIG. 5, or a shape similar thereto.

Figure 7:
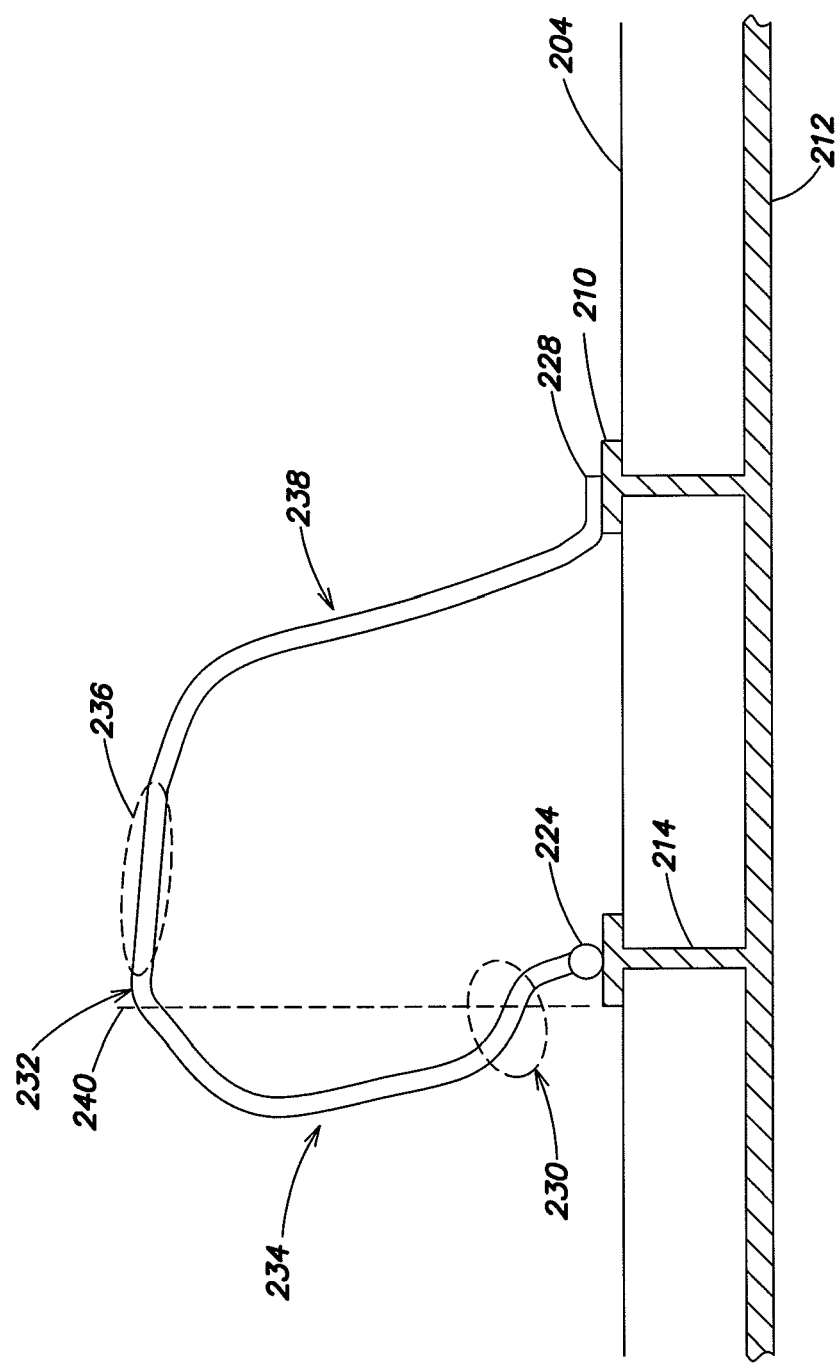
FIG. 7 is a diagram of one example of a wirebond spring according to aspects of the invention.

Referring to FIG. 7, there is illustrated one embodiment of a wirebond spring 216 bonded to wirebond pads 210 (or a track 218) provided on the substrate 204, as discussed above. In one embodiment, the wirebond spring 216 comprises a zone of inflection 230 near the ball bond 224. The wire extends upwardly from the zone of inflection 230 to a crest 232 of the wirebond spring 216. A convex region 234 extends between the zone of inflection 230 and the crest 232. The wirebond spring 216 further comprises an upper region 236 proximate the crest 232 and a downward sloping tail region 238 that extends between the upper region 236 and the second connection point 228. In one example, the upper region 236 is substantially flat so as to provide a large contact area with the upper conductive layer 222 (see FIG. 4), thereby facilitating a good electrical connection with the conductive layer. The zone of inflection 230 is used to make the wirebond spring 216 more resilient, compared to a conventional wirebond, contributing the spring effect of the wirebond spring and the ability of the wirebond spring with withstand the pressure applied by the mold chase and mold compound and to retain its shape during the transfer molding process 106, as discussed further below. In one example, the crest 232 of the wirebond spring is positioned substantially over the zone of inflection 236, as indicated by dotted line 240, which may further contribute to the resiliency of the wirebond spring 216, as discussed below.

Figure 8:
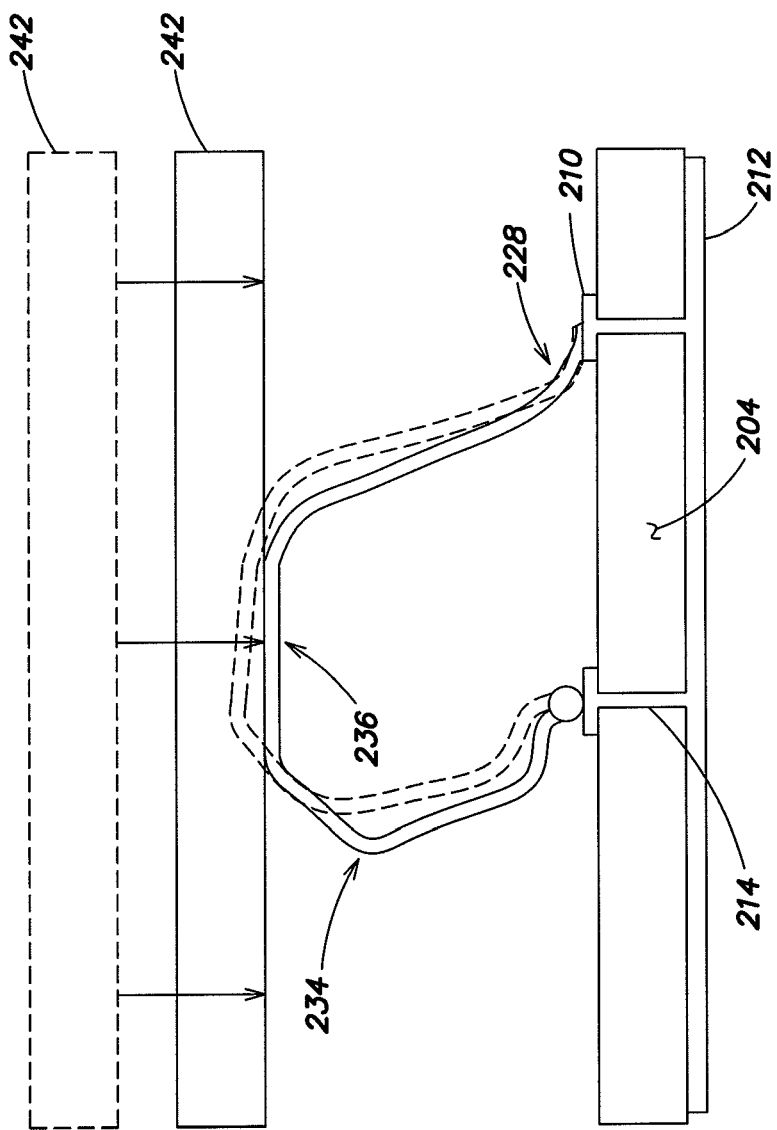
FIG. 8 is a diagram illustrating deformation of a wirebond spring during the transfer molding process, according to aspects of the invention.

As known to those skilled in the art and discussed above, during the transfer molding process, the device is placed in a lower mold chase, an upper mold chase is lowered onto the lower mold chase to a seal a cavity around the device, and the mold compound 220 is flowed into the cavity. The height of the wirebond spring 216, measured from the wirebond pad 210 to the crest 232, may be made slightly taller than the expected or designed thickness of the mold compound 220. During the transfer molding process (step 106), the wirebond spring 216 is compressed by the descending upper mold chase 242, as illustrated in FIG. 8. In one example, the upper mold chase 242 first makes contact the crest 232 of the wirebond spring 216, as the crest is the highest point of the wirebond spring. Due to the spring constant of the wirebond spring 216, provided by the zone of inflection 230 and the positioning of the crest 232 substantially over the zone of inflection, the wirebond spring remains in contact with the surface of the upper mold chase 242, as illustrated in FIG. 8. This spring effect provided by the shape of the wirebond spring 216 enables robust manufacturing of the integrated EMI shield because by causing the top of the wirebond spring to remain in contact with the surface of the mold chase, only a thin layer of mold compound may cover the top of the wirebond spring, such that the top of the wirebond spring may be easily and reliably exposed following the ablation process (step 108).

In one example, the wirebond spring 216 has a large spring range in the vertical direction and is able to absorb variations in finished height resulting from variations in the mold compound thickness, the substrate thickness and warpage that may occur during the transfer molding process. The height of the wirebond spring may be selected to be sufficiently high such that the wirebond spring is compressed when the upper mold chase 242 descends, but not so high that the descending upper mold chase crushes the wirebond spring. Thus, the wirebond spring should not be so high that the amount of deformation required to accommodate the descending upper mold chase 242 exceeds the spring capability of the wirebond spring. Similarly, the if the wirebond spring is not sufficiently high, the top of the wirebond spring may not contact or be sufficiently near the upper surface of the mold compound following the transfer molding process, and thus may not be exposed by the ablation process (step 108), or may not exhibit sufficient elastic deformation (spring effect) to hold the top of the wirebond spring in contact with the upper surface of the mold compound. In one example, the height of the wirebond spring 216 is about 90 microns taller than the designed thickness of the mold compound. However, it is to be appreciated that the wirebond spring may have a different height depending on factors such as, for example, the metal used to form the wirebond spring, the mold material, etc.

According to one embodiment, the shape of the wirebond spring 216 is optimized to provide a large contact area with the conductive layer 222, thereby facilitating good electrical connection with the conductive layer 222. As discussed above, in one example, the upper region 236 of the wirebond spring 216 is substantially flat. Thus, when compressed by the upper mold chase 242, the upper region 236 may provide a large flat area (length) that is in contact with the mold chase (or surface of the mold compound). This is the area that will be exposed at the top of the package by the ablation step (step 108) and in contact with the conductive layer 222 to form an electrical connection with the conductive layer 222 and complete the EMI shield.

Figure 9:
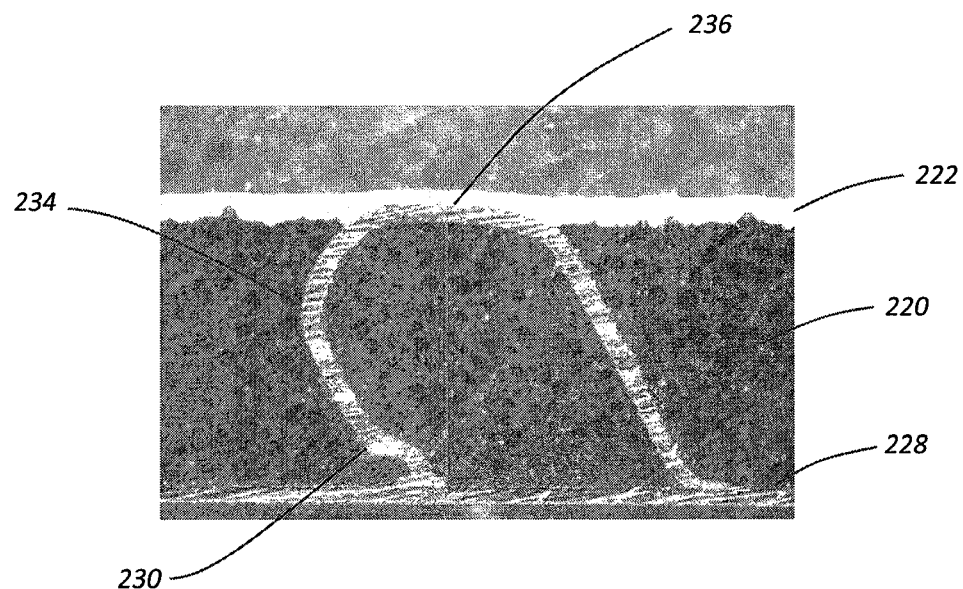
FIG. 9 is an image of one example of a wirebond spring incorporated in a device package according to aspects of the invention.
Figure 10:
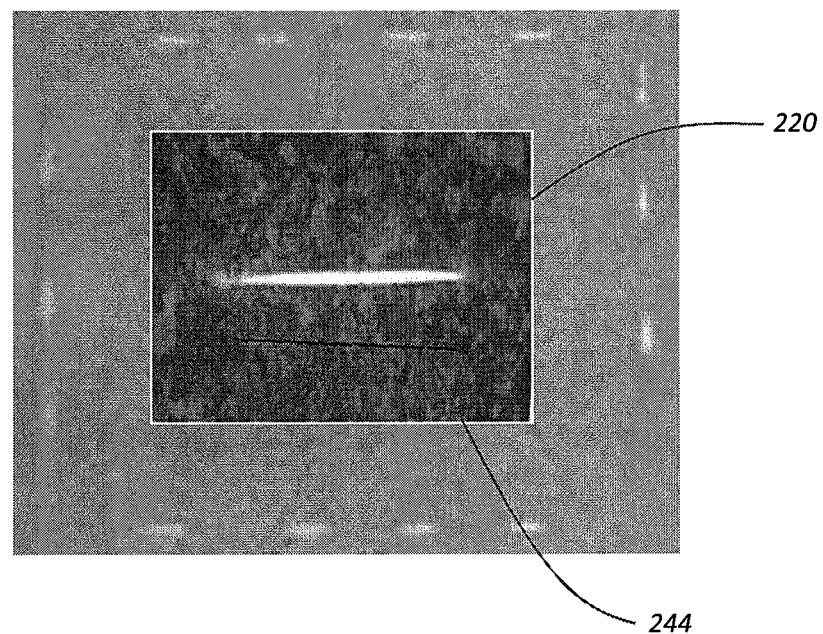
FIG. 10 is a plan view image of one example of a wirebond spring according to aspects of the invention.

Referring to FIG. 9, there is illustrated an image of one example of a wirebond spring incorporated in a device package. As illustrated in FIG. 9, the upper region 236 of the wirebond spring forms a large flat area on top of the mold compound 220 and in contact with the conductive layer 222. A plan view of the wirebond spring of FIG. 9 is illustrated in FIG. 10. Referring to FIG. 10, a long length 244 of exposed wire, predominantly, but not necessarily entirely, corresponding to the upper region 236 and crest 232 of the wirebond spring, can be seen on top of the mold compound 220. Manufactured and simulated examples of packages including wirebond springs have been created having an average exposure length 244 of about 400 microns, and a minimum exposure length of about 200 microns. These examples illustrate an improvement in the exposure length of the wire of about 10x compared to conventional wirebond loops (206 in FIG. 4A). This increased contact area provides a robust and low resistance electrical connection for the integrated EMI shield. Furthermore, if a material such as copper is used for the wirebond springs, rather than gold, for example to reduce cost, the large contact area may be particularly important as copper has a lower conductivity than does gold. In addition, as no solder is used to make the connection between the exposed region of the wirebond spring and the conductive layer 222, (the connection being made by the just contact between the two conductors), the larger the contact area, the more reliable the connection may be.

In addition to providing a spring effect and large contact area to facilitate a good and robust electrical connection with the conductive layer 222, the shape of the wirebond spring 216 also provide resiliency during the transfer molding process. Applicants have experimentally determined that it is important the wirebond springs remain upright during the transfer molding process so that the upper region is at or near the top of the mold compound and can be readily exposed with minimal ablation. Tests and simulations have demonstrated that conventionally-shaped wirebond loops fold and collapse during the transfer molding process because their shape provides little or no stability. As a result, the loops can move in any direction under pressure from the upper mold chase 242 and flowing mold compound. By contrast, the shape of the wirebond springs 216 controls movement of the wirebond spring to, predominantly, compression (elastic deformation) in the vertical direction (y-direction in FIG. 3), resulting in the spring effect discussed above. In one example, the wirebond springs are stiff in the in-plane direction (i.e., the x-z-direction in FIG. 3) and have good resistance to mold flow and wire sweep defects, which may be major concern with very high loops.

In summary, an effective, low cost and robust integrated EMI shield can be provided in any transfer molded module using only the ground plane typically already present in the module substrate, a thin layer of conductive material deposited on top of the mold compound, and a plurality of the wirebond springs discussed herein to connect the conductive layer to the ground plane, thereby forming a complete shield for some or all of the devices in the module. The wirebond springs may be placed anywhere in the package, with optional redundant connections to ensure the contact to the conductive layer 222 meets all electrical requirements, allowing for a very flexible EMI shield design that can be easily modified to accommodate different module layouts and devices. Similarly, as discussed above with reference to FIGS. 4A and 4B, the vias 214 connecting the wirebond pads 210 (or track 218) to the ground plane need not be coincident with each pad, or with specific locations on the ground plane, allowing for flexible pad 210 and via 214 placement in the module. The number of wirebond springs required to provide an adequate EMI shield depends on the operating frequency of the devices to be shielded and the level of shielding required. For example, the wire density (i.e., the spacing between immediately adjacent wirebond springs 216 in any given direction) may increase with increasing signal frequency. In one example, a wire spacing of about $\lambda/20$ (where $\lambda$ is the wavelength of the signal to be shielded) may be used. It is to be appreciated that the wire spacing need not be uniform, provided only that the minimum spacing to achieve desired shielding at a given frequency is maintained. Examples of wirebond spring EMI cages were tested and found to provide approximately a 20 dB shield, which is presently sufficient for most RF handset applications. Thus, the wirebond springs discussed herein can be used to provide a completely integrated EMI shield that is highly flexible and adds minimal cost, weight and/or size to the module. The wirebond springs may be processed using traditional processing techniques which are low cost, robust and do not require the procurement of any additional or specialized assembly equipment.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A packaged semiconductor module having an integrated electromagnetic interference shield comprising:
   a substrate having a ground plane;
   an electronic device mounted on a surface of the substrate;
   a plurality of wirebond springs disposed about the electronic device and electrically coupled to the ground plane, each of the plurality of wirebond springs including a loop of wire having a ball bond disposed on the surface of the substrate, a zone of inflection, a crest, a convex region extending between the zone of inflection and the crest, a sloping tail region having an end coupled to the substrate, and a substantially flat region extending between the crest and the sloping tail region;
   a mold compound covering the electronic device and at least partially covering the plurality of wirebond springs; and
   a conductive layer disposed on a top surface of the mold compound and electrically coupled to at least some of the plurality of wirebond springs, the plurality of wirebond springs, the conductive layer, and the ground plane together forming the integrated electromagnetic interference shield.

2. The packaged semiconductor module of claim 1 wherein the crest is positioned substantially vertically above the zone of inflection.

3. The packaged semiconductor module of claim 1 wherein each of the plurality of wirebond springs is formed of gold or copper wire.

4. The packaged semiconductor module of claim 1 further comprising first and second metalized connection points disposed on the surface of the substrate, the ball bond being coupled to the first metalized connection point and the end of the sloping tail region being coupled to the second metalized connection point.

5. The packaged semiconductor module of claim 1 further comprising a metalized wirebond connection track disposed on the surface of the substrate and electrically coupled to the ground plane, the ball bond and the end of the sloping tail region of each of the plurality of wirebond springs being connected to the metalized wirebond connection track.

6. The packaged semiconductor module of claim 5 further comprising a plurality of vias extending through the substrate and connecting the metalized wirebond connection track to the ground plane.

7. A packaged semiconductor module having an integrated electromagnetic interference shield comprising:
   a substrate having a ground plane, a first surface, and a plurality of metalized wirebond pads disposed on the first surface and electrically coupled to the ground plane;
   an electronic device mounted on the first surface of the substrate;
   a plurality of wirebond springs disposed about the electronic device and electrically coupled to the ground plane, each of the plurality of wirebond springs including a loop of wire that extends between two of the plurality of metalized wirebond pads on the substrate and is shaped to include a zone of inflection, a crest positioned substantially vertically above the zone of inflection, a sloping tail region terminating at a first one of the two of the plurality of metalized wirebond pads, and a substantially flat region extending between the crest and the sloping tail region;
   a mold compound covering the electronic device and at least partially covering the plurality of wirebond springs; and
   a conductive layer disposed over the mold compound and in electrical connection with the substantially flat region of each of the plurality of wirebond springs, the conductive layer, the plurality of wirebond springs, and the ground plane together forming the integrated electromagnetic interference shield.

8. The packaged semiconductor module of claim 7 wherein each of the plurality of wirebond springs is formed from gold or copper wire.

9. The packaged semiconductor module of claim 8 wherein the conductive layer includes silver-filled epoxy.

10. The packaged semiconductor module of claim 7 wherein the electronic device is an RF device.

11. The packaged semiconductor module of claim 7 wherein the loop of wire of each of the plurality of wirebond springs further includes a ball bond disposed on and electrically coupled to a second one of the two of the plurality of metalized wirebond pads.

12. The packaged semiconductor module of claim 7 wherein the loop of wire of each of the plurality of wirebond springs is further shaped to include a convex region extending between the zone of inflection and the crest.

13. The packaged semiconductor module of claim 7 wherein the ground plane is disposed on a second surface of the substrate, the second surface being positioned opposite the first surface, and the substrate further includes a plurality of metalized vias extending through the substrate and electrically connecting the ground plane to at least some of the plurality of metalized wirebond pads.

* * * * *